United States Patent
Harada et al.

(10) Patent No.: US 10,113,141 B2
(45) Date of Patent: Oct. 30, 2018

(54) CLEANING LIQUID FOR SEMICONDUCTOR DEVICE AND METHOD FOR CLEANING SUBSTRATE FOR SEMICONDUCTOR DEVICE

(71) Applicant: MITSUBISHI CHEMICAL CORPORATION, Chiyoda-ku (JP)

(72) Inventors: Ken Harada, Fukuoka (JP); Atsushi Ito, Fukuoka (JP); Toshiyuki Suzuki, Fukuoka (JP)

(73) Assignee: MITSUBISHI CHEMICAL CORPORATION, Chiyoda-ku (JP)

( * ) Notice: Subject to any disclaimer, the term of this patent is extended or adjusted under 35 U.S.C. 154(b) by 0 days.

(21) Appl. No.: 14/461,908

(22) Filed: Aug. 18, 2014

(65) Prior Publication Data

US 2014/0371124 A1 Dec. 18, 2014

Related U.S. Application Data

(63) Continuation of application No. PCT/JP2013/053584, filed on Feb. 14, 2013.

(30) Foreign Application Priority Data

Feb. 17, 2012 (JP) .................................. 2012-032860
Mar. 28, 2012 (JP) .................................. 2012-073633

(51) Int. Cl.
*C11D 11/00* (2006.01)
*C11D 1/12* (2006.01)
(Continued)

(52) U.S. Cl.
CPC ............ *C11D 11/0047* (2013.01); *B08B 3/04* (2013.01); *C11D 1/12* (2013.01); *C11D 1/83* (2013.01);
(Continued)

(58) Field of Classification Search
CPC .... C11D 1/12; C11D 1/22; C11D 1/75; C11D 3/044; C11D 3/2075; C11D 3/2079; C11D 3/2082; B08B 3/04
(Continued)

(56) References Cited

U.S. PATENT DOCUMENTS 6,143,705 A 11/2000 Kakizawa et al.
6,410,494 B2 6/2002 Kakizawa et al.
(Continued)

FOREIGN PATENT DOCUMENTS

JP 10-72594 3/1998
JP 2001-7071 1/2001
(Continued)

OTHER PUBLICATIONS

International Search Report dated May 14, 2012 in PCT/JP2013/053584 filed Feb. 14, 2013.
(Continued)

*Primary Examiner* — Gregory R Delcotto
(74) *Attorney, Agent, or Firm* — Oblon, McClelland, Maier & Neustadt, L.L.P.

(57) ABSTRACT

An object of the present invention is to provide a good cleaning liquid for semiconductor device which is used after a CMP step, and the present invention relates to a cleaning liquid for semiconductor device containing the following components (1) to (5) or (1)' to (4)':
  (1) an inorganic alkali;
  (2) a chelating agent;
  (3) an anionic surfactant selected from sulfonic acid type and sulfuric acid type anionic surfactants;
  (4) an amine oxide type surfactant; and
  (5) water, or
  (1)' an inorganic alkali;
  (2)' a carboxyl group-containing chelating agent;
(Continued)

EXAMPLE A-1

(3)' an anionic surfactant selected from a benzenesulfonic acid substituted with an alkyl group having from 8 to 20 carbon atoms and a salt thereof; and
(4)' water.

8 Claims, 5 Drawing Sheets

(51) Int. Cl.
    *B08B 3/04*     (2006.01)
    *C11D 3/20*     (2006.01)
    *H01L 21/02*     (2006.01)
    *C11D 1/83*     (2006.01)
    *C11D 3/04*     (2006.01)
    *C11D 1/831*     (2006.01)
    *C11D 3/02*     (2006.01)
    *C11D 1/22*     (2006.01)
    *C11D 1/75*     (2006.01)

(52) U.S. Cl.
    CPC ............... *C11D 1/831* (2013.01); *C11D 3/02* (2013.01); *C11D 3/044* (2013.01); *C11D 3/2079* (2013.01); *C11D 3/2082* (2013.01); *H01L 21/02074* (2013.01); *C11D 1/22* (2013.01); *C11D 1/75* (2013.01)

(58) Field of Classification Search
    USPC ....... 510/175, 176, 245, 264, 272, 426, 427, 510/435, 477, 488, 503; 134/1.2, 1.3
    See application file for complete search history.

(56) References Cited

U.S. PATENT DOCUMENTS

| | | |
|---|---|---|
| 6,492,308 B1 | 12/2002 | Naghshineh et al. |
| 6,514,921 B1 | 2/2003 | Kakizawa et al. |
| 6,730,644 B1 | 5/2004 | Ishikawa et al. |
| 7,084,097 B2 | 8/2006 | Ishikawa et al. |
| 8,110,534 B2 | 2/2012 | Kawase et al. |
| 8,338,087 B2 | 12/2012 | Rath et al. |
| 2001/0018407 A1 | 8/2001 | Kakizawa et al. |
| 2003/0083214 A1* | 5/2003 | Kakizawa ............... C11D 7/265 510/175 |
| 2004/0092102 A1* | 5/2004 | Li ........................... C09G 1/04 438/689 |
| 2004/0099290 A1* | 5/2004 | Morinaga ................ B08B 3/08 134/27 |
| 2004/0167047 A1 | 8/2004 | Ishikawa et al. |
| 2005/0020463 A1 | 1/2005 | Ikemoto et al. |
| 2005/0197265 A1 | 9/2005 | Rath et al. |
| 2007/0224760 A1* | 9/2007 | Matsui ..................... C09G 1/02 438/257 |
| 2008/0011321 A1 | 1/2008 | Ikemoto et al. |
| 2008/0045016 A1* | 2/2008 | Andou ..................... C11D 3/37 438/692 |
| 2008/0047592 A1* | 2/2008 | Fisher .................. C11D 3/0073 134/41 |
| 2008/0096785 A1* | 4/2008 | Egbe ....................... C11D 7/261 510/176 |
| 2008/0173328 A1* | 7/2008 | Nishiwaki ................ C11D 1/22 134/6 |
| 2009/0004608 A1 | 1/2009 | Sawada et al. |
| 2009/0239777 A1* | 9/2009 | Angst .................. C11D 3/0084 510/175 |
| 2010/0056409 A1* | 3/2010 | Walker ..................... C11D 7/06 510/175 |
| 2010/0056410 A1* | 3/2010 | Visintin .................. C11D 1/008 510/176 |
| 2010/0167535 A1* | 7/2010 | Nishiwaki ............ C11D 3/2075 438/669 |
| 2010/0167547 A1* | 7/2010 | Kamimura ............... C09G 1/02 438/693 |
| 2010/0167972 A1* | 7/2010 | Kawase ............... C11D 3/2075 510/175 |
| 2013/0109605 A1 | 5/2013 | Rath et al. |
| 2013/0174867 A1 | 7/2013 | Harada et al. |
| 2013/0225464 A1 | 8/2013 | Harada et al. |

FOREIGN PATENT DOCUMENTS

| | | |
|---|---|---|
| JP | 2003-013266 | 1/2003 |
| JP | 2003-109930 | 4/2003 |
| JP | 2003-289060 | 10/2003 |
| JP | 2007-213013 | 8/2007 |
| JP | 2007-526523 | 9/2007 |
| JP | 2007-254555 | 10/2007 |
| JP | 2003-536258 | 8/2008 |
| JP | 2009-4759 | 1/2009 |
| JP | 2009-206481 | 9/2009 |
| JP | 2009-218473 | 9/2009 |
| JP | 2009-263508 | 11/2009 |
| JP | 2010-087258 | 4/2010 |
| JP | 2010-163608 | 7/2010 |
| WO | 2009/125336 | 10/2009 |

OTHER PUBLICATIONS

Office Action dated Dec. 27, 2016, in Japanese Patent Application No. 2013-026857, filed Feb. 14, 2013 (with English Translation).
Office Action dated Dec. 27, 2016, in Japanese Patent Application No. 2013-026858, filed Feb. 14, 2013 (with English Translation).

\* cited by examiner

EXAMPLE A-1

EXAMPLE A-4

EXAMPLE B-1

EXAMPLE B-2

EXAMPLE B-3

COMPARATIVE EXAMPLE B-2

EXAMPLE B-4

EXAMPLE B-6

COMPARATIVE EXAMPLE B-1

CLEANING LIQUID FOR SEMICONDUCTOR DEVICE AND METHOD FOR CLEANING SUBSTRATE FOR SEMICONDUCTOR DEVICE

TECHNICAL FIELD

The present invention relates to a cleaning liquid for semiconductor device and a method for cleaning a substrate for semiconductor device, and in particular, the present invention relates to a cleaning liquid for effectively cleaning a surface of an substrate for semiconductor device in which a metal such as Cu, etc. is exposed on a surface thereof after conducting chemical mechanical polishing and a cleaning method using this cleaning liquid.

BACKGROUND ART

A substrate for semiconductor device is manufactured by forming deposit layers of a metal film working as a wiring and an interlayer insulating film on a silicon wafer substrate, subsequently conducting a surface planarization treatment by means of chemical mechanical polishing (hereinafter referred to as "CMP") with an abrasive composed of an aqueous slurry containing fine abrasive particles, and then stacking new layers on the planarized surface. In microfabrication of a substrate for semiconductor device, each layer is required to have planarity with high precision, and importance of the planarization treatment by means of CMP becomes more and more high.

In a manufacturing step of a semiconductor device in recent years, a wiring (Cu wiring) composed of a copper (Cu) film having a low value of resistance is introduced for the purpose of attaining increases in speed and integration degree in the device.

Although Cu is suited for microfabrication because of good workability, in view of the fact that Cu is easily oxidized and degraded in water and is easily corroded with acid components or alkali components, oxidation or corrosion of the Cu wiring is problematic in the CMP step.

For that reason, in CMP of a substrate for semiconductor device having a Cu wiring, an anticorrosive such as benzotriazole, tolyltriazole, or a derivative thereof, etc. is added to the abrasive, and this anticorrosive strongly adsorbs on the Cu surface to form a protective film, thereby suppressing the corrosion of the Cu wiring in CMP.

Large quantities of abrasive particles used in the CMP step, such as colloidal silica, etc., an anticorrosive-derived organic residue contained in the slurry, and the like are present on the surface of the substrate for semiconductor device after the CMP step, and therefore, in order to remove them, the substrate for semiconductor device after the CMP step is subjected to a cleaning step.

In cleaning after the CMP step, an acidic cleaning liquid and an alkaline cleaning liquid are used. In the acidic aqueous solution, the colloidal silica is positively charged, the substrate surface is negatively charged, and an electric attractive force acts, so that it becomes difficult to remove the colloidal silica. Meanwhile, in the alkaline aqueous solution, since abundant OH⁻ is present, both the colloidal silica and the substrate surface are negatively charged, and an electric repulsive force acts, so that it becomes easy to remove the colloidal silica.

In addition, in the acidic aqueous solution, Cu is oxidized into $Cu^{2+}$ and dissolved in the liquid, whereas in the alkaline aqueous solution, Cu forms a passive film such as $Cu_2O$ or CuO on a surface thereof. For this reason, as compared with the acidic cleaning liquid, when the alkaline cleaning liquid is used, the corrosion in the cleaning step can be decreased. From these facts, it may be said that the alkaline cleaning liquid is advantageous in cleaning a fine Cu wiring.

A surfactant is used as one of constituent components of this cleaning liquid. The surfactant plays an important role for enhancing an affinity of the cleaning liquid with a substrate surface which is subjective to cleaning. By enhancing the affinity of the cleaning liquid to the substrate surface due to the surfactant added in the cleaning liquid, it is also possible to enhance a cleaning performance which the cleaning liquid has.

Patent Documents 1 and 2 describe an acidic cleaning liquid of a substrate for electronic material containing, as a main component, an organic acid. However, as described above, in view of the fact that in the acidic aqueous solution, surfaces of abrasive particles used in the CMP step, such as colloidal silica, etc., are charged with a positive charge, whereas a surface of a substrate for electronic material is charged with a negative charge, an electric attractive force acts therebetween, and therefore, it is difficult to remove such fine particles by using an acidic cleaning liquid.

Meanwhile, Patent Document 3 discloses an acidic cleaning liquid of a substrate for semiconductor device containing an anionic surfactant. Here, in order to control the charge on a fine particle surface in an acidic aqueous solution, the anionic surfactant is utilized. However, as described above, since a large quantity of an OH⁻ ion is present in an alkaline liquid, from the standpoint of controlling the charge on the fine particle surface, it is clear that use of an alkaline cleaning liquid is more advantageous than use of an acidic cleaning liquid.

Patent Document 4 describes a cleaning liquid for cleaning an electronic circuit substrate, which contains tetramethylammonium hydroxide, monoethanolamine, and ascorbic acid. Since this cleaning liquid is an alkaline cleaning liquid, it may be expected that removal properties of fine particles are good. However, the monoethanolamine is high in corrosiveness against Cu, and in electronic circuits in which integration is advanced, corrosion thereof becomes a fatal defect, so that there is room for improvement.

In addition, although a KOH aqueous solution is preferable as the alkaline cleaning liquid because it is inexpensive in costs and high in safety, potassium that is an alkali metal remains on the substrate surface after cleaning.

Patent Document 5 describes a cleaning agent containing cysteine for cleaning a semiconductor substrate having a copper wiring given thereto after a CMP step. However, Patent Document 5 does not disclose a cleaning agent containing both an amino acid such as cysteine, etc. and an inorganic alkali. In addition, Patent Document 5 describes only results of observing corrosion of copper but does not describe a specific cleaning effect.

Patent Documents 6 and 7 disclose, as a cleaning agent of a glass substrate, a cleaning agent containing a specified anionic surfactant, an inorganic alkali, and a chelating agent. However, Patent Documents 6 and 7 do not describe that this cleaning agent was used for cleaning a semiconductor substrate after a CMP step.

Patent Document 8 discloses, as a cleaning agent for sacrificial anti-reflective material, a cleaning agent containing an alkali component, a chelating agent, and a surfactant. However, Patent Document 8 does not describe that this cleaning agent was used for cleaning a semiconductor substrate after a CMP step.

That is, it was not general to use an inorganic alkali as a substrate cleaning agent after the CMP step.

BACKGROUND ART DOCUMENT

Patent Document

Patent Document 1: JP-A-H10-72594
Patent Document 2: JP-A-2001-7071
Patent Document 3: JP-A-2009-4759
Patent Document 4: JP-T-2003-536258
Patent Document 5: JP-A-2003-13266
Patent Document 6: JP-A-2009-263508
Patent Document 7: JP-A-2009-206481
Patent Document 8: JP-T-2007-526523

SUMMARY OF INVENTION

Problem that Invention is to Solve

Under such circumstances, a first object of the present invention is to provide a cleaning liquid which is used for a cleaning step after a CMP step in a substrate for semiconductor device, in particular a substrate for semiconductor device having a metal wiring on a surface thereof and which is capable of removing fine particles derived from the CMP step without corroding a metal such as Cu, etc., and a cleaning method, wherein re-attachment onto the substrate surface can be further suppressed; and furthermore, a second object of the present invention is to provide a cleaning liquid which does not retain a large quantity of an alkali metal and a cleaning method.

Means for Solving Problem

In order to solve the above-described problem, the present inventors made extensive and intensive investigations. As a result, it has been found that the following inventions coincide with the above-described objects, leading to accomplishment of the present invention.

Specifically, the present invention is concerned with the following inventions.

[1] A cleaning liquid for semiconductor device, comprising the following components (1) to (5):
(1) an inorganic alkali;
(2) a chelating agent;
(3) an anionic surfactant which is at least either one of a sulfonic acid type anionic surfactant and a sulfuric acid type anionic surfactant;
(4) an amine oxide type surfactant; and
(5) water.

[2] The cleaning liquid for semiconductor device as described in [1] above,
wherein the anionic surfactant is at least one member selected from the group consisting of alkylsulfonic acids and salts thereof and alkylsulfuric acids and salts thereof.

[3] The cleaning liquid for semiconductor device as described in [1] or [2] above,
wherein the amine oxide type surfactant is an alkyldimethylamine oxide.

[4] The cleaning liquid for semiconductor device as described in any one of [1] to [3] above,
wherein the anionic surfactant is contained in a concentration of from 0.0005 to 0.05% by mass, and the amine oxide type surfactant is contained in a concentration of from 0.0005 to 0.1% by mass.

[5] The cleaning liquid for semiconductor device as described in any one of [1] to [4] above, which has a pH of 8 or more.

[6] A stock solution of the cleaning liquid for semiconductor device as described in any one of [1] to [5] above,
wherein the anionic surfactant is contained in a concentration of from 0.01 to 5% by mass, and the amine oxide type surfactant is contained in a concentration of from 0.01 to 10% by mass.

[7] A method for cleaning a substrate for semiconductor device, comprising cleaning a substrate for semiconductor device with the cleaning liquid for semiconductor device as described in any one of [1] to [5] above.

[8] The method for cleaning a substrate for semiconductor device as described in [7] above,
wherein the substrate for semiconductor device is a substrate having a Cu wiring and a low-dielectric constant insulating film on a surface thereof, the substrate being one after conducting chemical mechanical polishing.

[9] A cleaning liquid for semiconductor device, which is a cleaning liquid of a substrate for semiconductor device having a Cu wiring and a low-dielectric constant insulating film on a surface thereof, the substrate being one after conducting chemical mechanical polishing, the cleaning liquid comprising the following components (1)' to (4)':
(1)' an inorganic alkali;
(2)' a carboxyl group-containing chelating agent;
(3)' an anionic surfactant which is at least either one of a benzenesulfonic acid substituted with an alkyl group having from 8 to 20 carbon atoms and a salt thereof; and
(4)' water.

[10] The cleaning liquid for semiconductor device as described in [9] above, which has a pH of 9 or more.

[11] The cleaning liquid for semiconductor device as described in [9] or [10] above,
wherein the inorganic alkali is contained in a concentration of from 0.005 to 0.1% by mass, and the chelating agent is contained in a concentration of from 0.005 to 0.1% by mass.

[12] The cleaning liquid for semiconductor device as described in any one of [9] to [11] above,
wherein the inorganic alkali is potassium hydroxide.

[13] The cleaning liquid for semiconductor device as described in any one of [9] to [12] above,
wherein the anionic surfactant is dodecylbenzenesulfonic acid.

[14] The cleaning liquid for semiconductor device as described in any one of [9] to [13] above,
wherein the chelating agent is at least one member selected from the group consisting of organic acids, amino acids, N-acetylamino acids and salts thereof.

[15] A stock solution of the cleaning liquid for semiconductor device as described in any one of [9] to [14] above,
wherein the inorganic alkali is contained in a concentration of from 0.1 to 10% by mass, and the chelating agent is contained in a concentration of from 0.1 to 10% by mass.

[16] A method for cleaning a substrate for semiconductor device, comprising cleaning a substrate for semiconductor device having a Cu wiring and a low-dielectric constant insulating film on a surface thereof, the substrate being one after conducting chemical mechanical polishing, with the cleaning liquid for semiconductor device as described in any one of [9] to [14] above.

Effects of Invention

By using the cleaning liquid for semiconductor device of the present invention, in a cleaning step of a substrate for semiconductor device after a CMP step, removal of fine particles derived from the CMP step becomes easier and re-attachment of the fine particles onto a substrate surface can be effectively suppressed without corroding a metal such as Cu, etc., thereby conducting efficient cleaning.

In addition, even by using an inorganic alkali-containing alkaline cleaning liquid, efficient cleaning with the above-described effect can be conducted without retaining a large quantity of an alkali metal.

MODE FOR CARRYING OUT INVENTION

Figure 1:
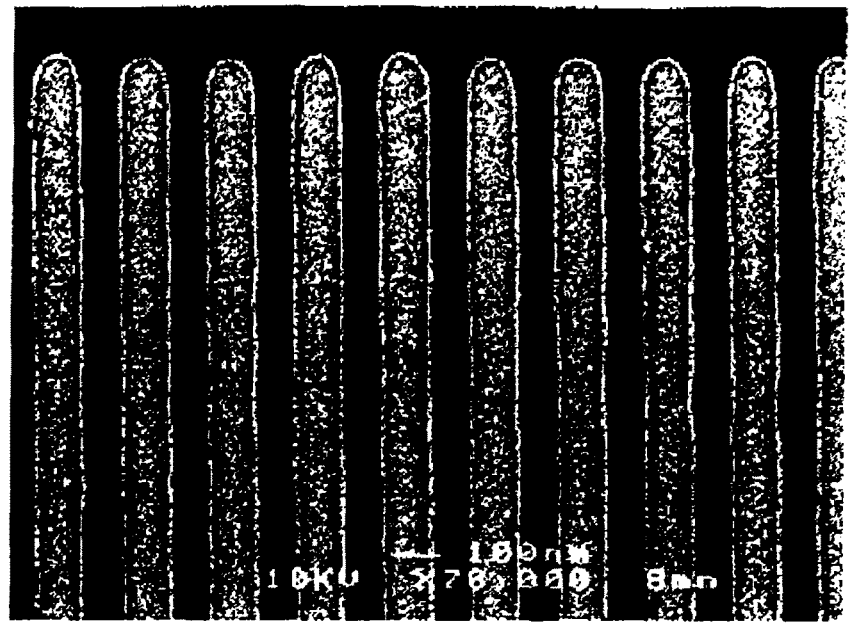
FIG. 1 is an SEM image of a patterned substrate surface after a dipping experiment in Example A-1.

Embodiments of the present invention are hereunder specifically described, but it should not be construed that the present invention is limited to the following embodiments, and the present invention can be carried out by making various changes within the scope of a gist thereof.

Here, the terms "% by weight" and "ppm by weight" are synonymous with "% by mass" and "ppm by mass", respectively. In addition, in the case where the term "ppm" is simply described, "ppm by weight" is meant.

[Cleaning Liquid a for Semiconductor Device]

A cleaning liquid A for semiconductor device of the present invention (hereinafter sometimes referred to as "cleaning liquid A of the present invention") is a cleaning liquid which is used for cleaning of a substrate for semiconductor device, and preferably used in a cleaning step of a substrate for semiconductor device to be conducted after a chemical mechanical polishing (CMP) step in the manufacture of a semiconductor device, the cleaning liquid A being a cleaning liquid for semiconductor device containing all of the following components (1) to (5):
(1) an inorganic alkali,
(2) a chelating agent,
(3) an anionic surfactant which is at least either one of a sulfonic acid type anionic surfactant and a sulfuric acid type anionic surfactant,
(4) an amine oxide type surfactant, and
(5) water.

The cleaning liquid A of the present invention contains, as essential components, at least either one of anionic surfactants selected from sulfonic acid type and sulfuric acid type anionic surfactants, and an amine oxide type surfactant. In view of the fact that the both components exhibit a synergistic effect, the cleaning liquid A of the present invention enhances an affinity of the cleaning liquid with a substrate surface which is subjective to cleaning, thereby enhancing a cleaning effect, making removal of fine particles derived from the CMP step easy and suppressing re-attachment of the fine particles onto the substrate surface.

The amine oxide type surfactant which is used in the present invention does not have cleaning ability per se, and according to a single treatment thereof, a cleaning effect is not obtained; however, when used in combination with the sulfonic acid type or sulfuric acid type anionic surfactant, the amine oxide type surfactant has a function to reinforce the cleaning ability of this anionic surfactant. That is, the sulfonic acid type or sulfuric acid type anionic surfactant has a large hydrophilic group, whereas the amine oxide type surfactant has a small hydrophilic group.

So long as only surfactant molecules having a large hydrophilic group are concerned, the molecules interfere with each other, and a solid-liquid interface cannot be uniformly covered; however, by combining these surfactants, a configuration of the surfactant molecules is put in order, and the surfactant molecules can be uniformly coordinated relative to a solid-liquid interface, whereby a good cleaning effect is obtained.

In addition, the cleaning liquid A of the present invention is an alkaline cleaning liquid containing, as a main component, an inorganic alkali.

In general, in the case of cleaning with a cleaning liquid using a compound containing a metal component such as an alkali metal, etc. as an inorganic alkali, there is involved such an inherent problem that a large quantity of a part of the metal component remains on the substrate surface. However, in view of the fact that the cleaning liquid A of the present invention contains, as essential components, a chelating agent and a specified anionic surfactant, the matter that a large quantity of the metal component such as an alkali metal, etc. remains on the substrate surface after cleaning is prevented from occurring by the action of the chelating agent in the cleaning liquid, and wettability with the hydrophobic substrate surface is enhanced by the anionic surfactant, whereby an excellent cleaning effect can be exhibited.

Each of the components which are contained in the cleaning liquid A of the present invention is hereunder described in detail.

<Inorganic Alkali>

By using the inorganic alkali, the cleaning liquid A of the present invention exhibits alkalinity. The inorganic alkali which is used for the cleaning liquid A of the present invention refers to an inorganic compound containing mainly an alkali metal or an alkaline earth metal, or a salt thereof among materials exhibiting alkalinity in an aqueous solution thereof. Above all, it is preferable to use an alkali metal-containing hydroxide as the inorganic alkali from the standpoint of safety or costs.

Specifically, examples thereof include lithium hydroxide, sodium hydroxide, potassium hydroxide, rubidium hydroxide, cesium hydroxide, and the like. It is to be noted that although commercially available products may be used as the inorganic alkali, in the case of producing an inorganic alkali, it is preferable to use a material in which a heavy metal component or a metal component is decreased as far as possible at a production stage thereof.

These inorganic alkalis may be used solely, or may be used in combination of two or more kinds thereof in an arbitrary proportion. Above all, it is more preferable to use potassium hydroxide.

It is to be noted that it is preferable that the cleaning liquid A of the present invention has a pH or 8 or more. When the pH of the cleaning liquid is 8 or more, a zeta potential of colloidal silica or the like in the liquid is lowered, and an electric repulsive force against the substrate is gained, whereby not only removal of fine particles can be made easy, but re-attachment of the removed fine particles onto the substrate surface which is subjective to cleaning can be suppressed.

Here, in order to more decrease the zeta potential, the pH of the cleaning liquid A of the present invention is preferably 9 or more, and more preferably 10 or more. In addition, an upper limit of the pH of the cleaning liquid A of the present invention is usually not more than 14 in view of the fact that the present liquid is an aqueous solution.

It is to be noted that the pH in the cleaning liquid A of the present invention can be adjusted by the addition amounts of the inorganic alkali and other components contained in the cleaning liquid.

<Chelating Agent>

Suitable examples of the chelating agent which is used for the cleaning liquid A of the present invention include organic acids such as acetic acid, oxalic acid, tartaric acid, citric acid, etc. and salts thereof; amino acids such as glycine, alanine, cysteine, histidine, aspartic acid, arginine, methionine, etc. and derivatives thereof; inorganic alkalis such as ammonia, etc. and salts thereof; alkylamines such as trimethylamine, triethylamine, ethylenediamine, ethylenediaminetetraacetic acid, etc. and derivatives thereof; and alkanolamines such as monoethanolamine, etc. and derivatives thereof.

It is to be noted that the chelating agent may be used solely, or may be used in combination of two or more kinds thereof in an arbitrary proportion.

Especially preferred examples of the chelating agent include organic acids such as oxalic acid, tartaric acid, citric acid, etc. and salts thereof; amino acids such as glycine, alanine, cysteine, histidine, aspartic acid, arginine, etc. and derivatives thereof; inorganic alkalis such as ammonia, etc. and salts thereof; alkylamines such as ethylenediamine, ethylenediaminetetraacetic acid, etc. and derivatives thereof; and alkanolamines such as monoethanolamine, etc. and derivatives thereof.

It is to be noted that although a part of the above-described chelating agents overlaps the above-described inorganic alkali which is used for the cleaning agent A of the present invention, such an overlapping compound becomes a component serving as both the chelating agent and the inorganic alkali.

<Anionic Surfactant Selected from Sulfonic Acid Type and Sulfuric Acid Type Anionic Surfactants>

As the anionic surfactant selected from sulfonic acid type and sulfuric acid type anionic surfactants, which is used for the cleaning liquid A of the present invention, at least one member selected from the group consisting of alkylsulfonic acids and salts thereof and alkylsulfuric acids and salts thereof can be suitably used.

Specifically, suitable examples thereof include alkylbenzenesulfonic acids and salts thereof (the carbon number of the alkyl group is preferably from 8 to 20), alkanesulfonic acids and salts thereof (the carbon number of the alkyl group is preferably from 8 to 20), alkyldiphenyl ether disulfonic acids and salts thereof (the carbon number of the alkyl group is preferably from 8 to 20), alkylmethyl taurine acids and salts thereof (the carbon number of the alkyl group is preferably from 8 to 20), and sulfosuccinic acid diesters and salts thereof.

It is to be noted that the anionic surfactant selected from sulfonic acid type and sulfuric acid type anionic surfactants may be used solely, or may be used in combination of two or more kinds thereof in an arbitrary proportion.

Especially preferred examples of the anionic surfactant selected from sulfonic acid type and sulfuric acid type anionic surfactants include dodecylbenzenesulfonic acid, dodecanesulfonic acid, and alkali metal salts thereof, and the like.

Above all, dodecylbenzenesulfonic acid and an alkali metal salt thereof are suitably used from the standpoint of stability of quality or easiness of availability.

<Amine Oxide Type Surfactant>

Examples of the amine oxide type surfactant which is used for the cleaning liquid A of the present invention include alkyldimethylamine oxides (the carbon number of the alkyl group is preferably from 8 to 20). Above all, suitable examples thereof include lauryldimethylamine oxide and oleyldimethylamine oxide.

It is to be noted that the amine oxide type surfactant may be used solely, or may be used in combination of two or more kinds thereof in an arbitrary proportion.

Lauryldimethylamine oxide is especially suitably used as the amine oxide type surfactant from the standpoint of stability of quality or easiness of availability.

<Water>

As for water which is used as a solvent in the cleaning liquid A of the present invention, it is preferable to use deionized water or ultrapure water from which impurities are decreased as far as possible.

<Other Components>

The cleaning liquid A of the present invention may contain other components than the above-described components (1) to (5) in arbitrary proportions within a range where its performance is not impaired.

The following are exemplified as other components.

Nitrogen-containing organic compounds such as benzotriazole and a derivative thereof, triazole and a derivative thereof, imidazole and a derivative thereof, 3-aminotriazole, $N(R)_3$ (each R may be the same as or different from every other R and represents a hydroxyalkyl group having from 1 to 4 carbon atoms), urea, thiourea, etc.;

Water-soluble polymers such as polyethylene glycol, polyvinyl alcohol, etc.;

Alkanols having from 1 to 4 carbon atoms;

Dissolved gases such as hydrogen, argon, nitrogen, carbon dioxide, etc.;

Etching accelerators which can be expected to exhibit an effect for removing a polymer firmly attached after dry etching, or the like, such as hydrofluoric acid, ammonium fluoride, BHF (buffered hydrofluoric acid), etc.;

Reducing agents such as hydrazine, etc.; and

Oxidizing agents such as hydrogen peroxide, ozone, oxygen, etc.

In addition, the cleaning liquid A of the present invention may also contain, as the solvent, other components than water, such as ethanol, etc.

<Concentration of Each of the Components in the Cleaning Liquid A>

A concentration of the anionic surfactant selected from sulfonic acid type and sulfuric acid type anionic surfactants in the cleaning liquid A for semiconductor device of the present invention is preferably from 0.0005 to 0.05% by mass, and more preferably from 0.0005 to 0.01% by mass.

When the concentration of the anionic surfactant selected from sulfonic acid type and sulfuric acid type anionic surfactants is less than 0.0005% by mass, there is a possibility that decontamination ability of the substrate for semiconductor device cannot be exhibited, whereas even when it exceeds 0.05% by mass, not only more effects are not obtained, but the cost of the cleaning liquid is more increased.

In addition, a concentration of the amine oxide type surfactant in the cleaning liquid A for semiconductor device of the present invention is preferably from 0.0005 to 0.1% by mass, and more preferably from 0.001 to 0.05% by mass.

When the concentration of the amine oxide type surfactant is less than 0.0005% by mass, there is a possibility that decontamination ability of the substrate for semiconductor device cannot be exhibited, whereas even when it exceeds 0.1% by mass, not only more effects are not obtained, but the cost of the cleaning liquid is more increased.

It is to be noted that there may be the case where in general, a surfactant in a commercially available mode contains metal impurities such as Na, K, Fe, etc. in an amount of from about 1 to several thousand ppm by mass, and in that case, the surfactant becomes a metal contamination source. For that reason, in the case where the surfactant contains metal impurities, it is preferable that the surfactant is used after purification such that a content of each of the metal impurities is usually not more than 10 ppm, preferably not more than 1 ppm, and more preferably not more than 0.3 ppm.

As this purification method, for example, a method in which the surfactant is dissolved in water and then allowed to pass through an ion exchange resin, thereby making the resin capture the metal impurities thereon is suitable. By using the thus purified surfactant, a cleaning liquid in which the content of the metal impurities is extremely decreased can be obtained.

In the present invention, it is preferable that the content of the metal impurities derived from the surfactant in the cleaning liquid A is decreased to not more than 1 ppm by a purification treatment of the surfactant to be used as the need arises.

It is to be noted that the inorganic alkali in the cleaning liquid A for semiconductor device of the present invention is used only in an amount necessary for controlling the cleaning liquid of the present invention to a desired pH.

In addition, with respect to the chelating agent, although a concentration of the total chelating agent in the cleaning liquid A varies depending upon whether or not the chelating agent also serves as the inorganic alkali (in the case where the inorganic alkali also functions as a chelating agent, the instant chelating agent is also included), it is preferably from 0.1 to 10% by mass, and especially preferably from 0.5 to 10% by mass. When the concentration of the chelating agent in the cleaning liquid A is less than the above-described lower limit, the effect as the chelating agent is hardly revealed, whereas when it exceeds the above-described upper limit, there is a concern that a metal part such as a copper wiring, etc. is dissolved.

[Cleaning Liquid B for Semiconductor Device]

A cleaning liquid B for semiconductor device of the present invention (hereinafter sometimes referred to as "cleaning liquid B of the present invention") is a cleaning liquid which is used in a cleaning step of a substrate for semiconductor device having a Cu wiring and a low-dielectric constant insulating film on a surface thereof, wherein the cleaning step is conducted after a chemical mechanical polishing (CMP) step in the manufacture of a semiconductor device, and the cleaning liquid B is a cleaning liquid for semiconductor device containing all of the following components (1)' to (4)':

(1)' an inorganic alkali,
(2)' a carboxyl group-containing chelating agent,
(3)' an anionic surfactant which is at least either one of benzenesulfonic acid substituted with an alkyl group having from 8 to 20 carbon atoms and a salt thereof, and
(4)' water.

The cleaning liquid B of the present invention contains, as essential components, an inorganic alkali such as potassium hydroxide, etc., a carboxyl group-containing chelating agent selected from an amino acid or an N-acetylamino acid, and the like, and a specified anionic surfactant. The cleaning liquid B of the present invention is able to prevent retention of a large quantity of the metal component such as an alkali metal, etc. on the substrate surface after cleaning from occurring by the action of the chelating agent in the cleaning liquid and to enhance wettability with the hydrophobic substrate surface by the anionic surfactant, whereby an excellent cleaning effect can be exhibited.

Each of the components which are contained in the cleaning liquid B of the present invention is hereunder described in detail.

<Inorganic Alkali>

By using the inorganic alkali, the cleaning liquid B of the present invention exhibits alkalinity. The inorganic alkali which is used for the cleaning liquid B of the present invention refers to an inorganic compound containing mainly an alkali metal or an alkaline earth metal, or a salt thereof among materials exhibiting alkalinity in an aqueous solution thereof. Above all, it is preferable to use an alkali metal-containing hydroxide as the inorganic alkali from the standpoint of safety or costs. Specifically, examples thereof include lithium hydroxide, sodium hydroxide, potassium hydroxide, rubidium hydroxide, cesium hydroxide, and the like. It is to be noted that although commercially available products may be used as the inorganic alkali, in the case of producing an inorganic alkali, it is preferable to use a material in which a heavy metal component or a metal component is decreased as far as possible at a production stage thereof.

These inorganic alkalis may be used solely, or may be used in combination of two or more kinds thereof in an arbitrary proportion. Above all, it is more preferable to use potassium hydroxide.

<Chelating Agent>

Preferred examples of the carboxyl group-containing chelating agent which is used for the cleaning liquid B of the present invention include organic acids, amino acids, N-acetylamino acids, and salts thereof. Examples of the salt include those selected from alkali metal salts and alkaline earth metal salts such as potassium salts, sodium salts, calcium salts, etc., and ammonium salts.

In the present invention, the chelating agent has an action to dissolve and remove an impurity metal contained in a metal wiring on a substrate surface which is subjective to cleaning, such as tungsten, etc., and an insoluble metal complex of an anticorrosive with copper, and an alkali metal such as sodium, potassium, etc., which are present in a barrier slurry used in the CMP step, due to a chelating action.

The organic acid as the carboxyl group-containing chelating agent as referred to in the present invention means a compound other than amino acids, having from 1 to 4 carboxyl groups in a molecule thereof, and examples thereof include aliphatic carboxylic acids, aromatic carboxylic acids, and the like.

Examples of the aliphatic carboxylic acid include monocarboxylic acids, dicarboxylic acids, and tricarboxylic acids.

Examples of the monocarboxylic acid include formic acid, acetic acid, glycolic acid, lactic acid, and the like.

Examples of the dicarboxylic acid include oxalic acid, malonic acid, succinic acid, tartaric acid, malic acid, and the like.

Examples of the tricarboxylic acid include citric acid and the like.

Examples of the aromatic carboxylic acid include gallic acid, picolinic acid, quinaldic acid, and the like.

Besides these chelating agents, ethylenediaminetetraacetic acid and the like can also be used. In addition, salts thereof, for example, alkali metal salts and alkaline earth metal salts such as potassium salts, sodium salts, calcium salts, etc., and ammonium salts can also be suitably used.

In the present invention, a sulfur atom-containing amino acid is preferable as the carboxyl group-containing chelating agent from the standpoint that it has a strong interaction with copper present on the substrate surface, and examples thereof include cysteine, N-acetylcysteine, cystine, mercaptoacetic acid, and the like.

These carboxyl group-containing chelating agents may be used solely, or may be used in combination of two or more kinds thereof in an arbitrary proportion.

<Anionic Surfactant>

The anionic surfactant which is used for the cleaning liquid B of the present invention is selected from a benzenesulfonic acid substituted with an alkyl group having from 8 to 20 carbon atoms and a salt thereof.

Specifically, examples thereof include octylbenzenesulfonic acid, decylbenzenesulfonic acid, dodecylbenzenesulfonic acid, tetradecylbenzenesulfonic acid, and alkali metal salts and alkaline earth metal salts thereof, such as potassium salts, sodium salts, calcium salts, etc. and ammonium salts, and the like.

These may be used solely, or may be used in combination of two or more kinds thereof in an arbitrary proportion.

Above all, it is preferable to use dodecylbenzenesulfonic acid particularly from the standpoint of stability or easiness of availability.

<Water>

As for water which is used as a solvent in the cleaning liquid B of the present invention, it is preferable to use deionized water or ultrapure water from which impurities are decreased as far as possible.

<Other Components>

The cleaning liquid B of the present invention may contain other components than the above-described components (1)' to (4)' in arbitrary proportions within a range where its performance is not impaired.

The following are exemplified as other components.

Nonionic surfactants such as polyoxyethylene lauryl ether, etc., anionic surfactants such as polyoxyethylene lauryl ether acetic acid, etc., amine oxide type surfactants such as lauryldimethylamine oxide, etc., and salts thereof;

Organic alkalis that are a quaternary ammonium salt such as tetramethylammonium hydroxide, choline, etc. or a salt thereof;

Nitrogen-containing organic compounds such as benzotriazole and a derivative thereof, triazole and a derivative thereof, imidazole and a derivative thereof, 3-aminotriazole, $N(R)_3$ (each R may be the same as or different from every other R, and represents an alkyl group having from 1 to 4 carbon atoms and/or a hydroxyalkyl group having from 1 to 4 carbon atoms), urea, thiourea, etc.;

Water-soluble polymers such as polyethylene glycol, polyvinyl alcohol, etc.;

Alkanols having from 1 to 4 carbon atoms;

Dissolved gases such as hydrogen, argon, nitrogen, carbon dioxide, ammonia, etc.;

Etching accelerators which can be expected to exhibit an effect for removing a polymer firmly attached after dry etching, or the like, such as hydrofluoric acid, ammonium fluoride, BHF (buffered hydrofluoric acid), etc.;

Reducing agents such as hydrazine, etc.; and

Oxidizing agents such as hydrogen peroxide, ozone, oxygen, etc.

In addition, the cleaning liquid B of the present invention may also contain, as the solvent, other components than water, such as ethanol, etc.

<Concentration of Each of the Components in the Cleaning Liquid B>

A concentration of the inorganic alkali in the cleaning liquid B for semiconductor device of the present invention is usually from 0.005 to 0.1% by mass, preferably from 0.01 to 0.1% by mass, and more preferably from 0.02 to 0.08% by mass. When the concentration of the inorganic alkali is less than 0.005% by mass, there is a possibility that decontamination ability of the substrate for semiconductor device cannot be exhibited, whereas even when it exceeds 0.1% by mass, not only more effects are not obtained, but the cost of the cleaning liquid is more increased.

It is to be noted that the inorganic alkali such as potassium hydroxide, etc. is used for the purpose of adjusting a pH of the cleaning liquid, and the pH of the cleaning liquid B for semiconductor device of the present invention is preferably 9 or more, more preferably from 10 to 14, and especially preferably from 10 to 12.

In addition, a concentration of the carboxyl group-containing chelating agent in the cleaning liquid B for semiconductor device of the present invention is usually from 0.005 to 0.1% by mass, preferably from 0.01 to 0.1% by mass, and more preferably from 0.02 to 0.08% by mass. When the concentration of the carboxyl group-containing chelating agent is less than 0.005% by mass, there is a possibility that decontamination ability of the substrate for semiconductor device cannot be exhibited, whereas even when it exceeds 0.1% by mass, not only more effects are not obtained, but the cost of the cleaning liquid is more increased.

In addition, a concentration of the above-described anionic surfactant in the cleaning liquid B for semiconductor device of the present invention is usually from 0.0005 to 0.01% by mass, preferably from 0.001 to 0.01% by mass, and more preferably from 0.002 to 0.008% by mass. When the concentration of the anionic surfactant is less than 0.0005% by mass, there is a possibility that decontamination ability of the substrate for semiconductor device cannot be exhibited, whereas even when it exceeds 0.01% by mass, not only more effects are not obtained, but the cost of the cleaning liquid is more increased.

In addition, by blending the cleaning liquid B for semiconductor device of the present invention with, as other component, a surfactant, for example, polyoxyethylene lauryl ether acetic acid, lauryldimethylamine oxide, etc., there gives rise to such an effect that wettability with the hydrophobic substrate surface is enhanced. In that case, a concentration thereof in the cleaning liquid B is preferably from 0.0005 to 0.1% by mass, and more preferably from 0.001 to 0.05% by mass.

<Production Method of Cleaning Liquid>

A production method of the cleaning liquid A or B of the present invention is not particularly limited, and a conventionally known method may be adopted. For example, the cleaning liquid can be produced by mixing the constituent components thereof. In general, the cleaning liquid is produced by adding the other components to water as the solvent.

On that occasion, the mixing order is arbitrary unless otherwise an exceptional problem such as generation of a reaction or a precipitate arises. Among the constituent components of the cleaning liquid, any two components or three or more components may be blended in advance and then mixed with the residual components, or all of the components may be mixed at once.

The cleaning liquid A or B of the present invention can be produced by adjusting the concentration of each of the components such that it is a concentration suited for cleaning. However, from the viewpoint of suppressing the costs at the time of transportation or storage, in many cases, a cleaning liquid containing the respective components in high concentrations (hereinafter sometimes referred to as "cleaning liquid stock solution") is produced and then diluted with water for use.

Although the concentration of each of the components in this cleaning liquid stock solution is not particularly limited, it preferably falls within the range where the respective essential components and the other components to be added as the need arises as well as a reaction product thereof are neither separated nor deposited in the cleaning liquid stock solution.

Specifically, a suitable concentration range of the cleaning liquid A stock solution is such that the concentration of the anionic surfactant selected from sulfonic acid type and sulfuric acid type anionic surfactants is from 0.01 to 5% by mass, and the concentration of the amine oxide type surfactant is from 0.01 to 10% by mass.

In addition, a suitable concentration range of the cleaning liquid B stock solution is such that the concentration of the above-described inorganic alkali is from 0.1 to 10% by mass, the concentration of the above-described chelating agent is from 0.1 to 10% by mass, and the concentration of the above-described anionic surfactant of from 0.01 to 1% by mass.

Within such a concentration range, the separation of the components contained is hardly generated at the time of transportation or storage, and when water is added, the resulting solution can be suitably used as the cleaning liquid A or B having a suitable concentration for cleaning with ease.

The concentration of each of the components of the cleaning liquid A or B in cleaning the substrate for semiconductor device is properly determined according to the substrate for semiconductor device which is subjective to cleaning.

It is to be noted that the cleaning liquid to be subjected to cleaning may be produced by diluting the cleaning liquid stock solution such that the concentration of each of the components is appropriate relative to the substrate for semiconductor device which is subjective to cleaning, or may be produced by directly adjusting each of the components so as to have that concentration.

<Cleaning Method of Substrate for Semiconductor Device>

Next, a method for cleaning the substrate for semiconductor device of the present invention (hereinafter sometimes referred to as "cleaning method of the present invention") is described.

The cleaning method of the present invention is conducted by a method of bringing the above-described cleaning liquid A or B of the present invention into direct contact with a substrate for semiconductor device.

Examples of the substrate for semiconductor device which is subjective to cleaning include various substrates for semiconductor device, such as a semiconductor, a glass, a metal, a ceramic, a resin, a magnetic material, a superconductor, etc.

Above all, the cleaning liquid A or B of the present invention is especially suitable for substrates for semiconductor device having a metal or a metal compound as a wiring or the like on a surface thereof because it can be removed by means of rinsing within a short time.

Here, examples of the above-described metal which is used for the substrate for semiconductor device include W, Cu, Ti, Cr, Co, Zr, Hf, Mo, Ru, Au, Pt, Ag, and the like, and examples of the metal compound include nitrides, oxides, and silicides of these metals, and the like. Above all, Cu and compounds containing the same are a suitable subject to cleaning.

In addition, the cleaning method of the present invention is also suitable for a substrate for semiconductor device having a low-dielectric constant insulating material because it is also high in a cleaning effect for low-dielectric constant insulating materials with strong hydrophobicity.

Examples of such a low-dielectric constant insulating material include organic polymer materials such as polyimides, BCB (benzocyclobutene), Flare (manufactured by Honeywell), SiLK (manufactured by Dow Chemical), etc.; inorganic polymer materials such as FSG (fluorinated silicate glass), etc.; and SiOC-based materials such as BLACK DIAMOND (manufactured by Applied Materials), Aurora (manufactured by ASM Japan K.K.), etc.

Here, the cleaning method of the present invention is especially preferably applied to the case of cleaning a substrate for semiconductor device after CMP treatment, the substrate having a Cu wiring and a low-dielectric constant insulating film on the substrate surface.

In the CMP step, polishing is conducted by rubbing the substrate on a pad by using an abrasive.

The abrasive contains abrasive particles of colloidal silica ($SiO_2$), fumed silica ($SiO_2$), alumina ($Al_2O_3$), ceria ($CeO_2$), or the like. Such abrasive particles are a main cause of fine particle contamination of the substrate for semiconductor device. However, the cleaning liquid A or B of the present invention has an action to not only remove the fine particles attached onto the substrate to disperse them in the cleaning liquid but prevent re-attachment thereof from occurring, and hence, it exhibits a high effect for removing the fine particle contamination.

In addition, there may be the case where the abrasive contains additives other than the abrasive particles, such as an oxidizing agent, a dispersant, etc.

In particular, in CMP polishing on the substrate for semiconductor device having a Cu film as a metal wiring on a surface thereof, the Cu film is easily corroded, and therefore, in many cases, an anticorrosive is added.

An azole-based anticorrosive having a high anticorrosion effect is preferably used as the anticorrosive. More specifically, as an anticorrosive containing a heterocyclic ring having only a nitrogen atom as a hetero atom, examples thereof include diazole-based, triazole-based, and tetrazole-based anticorrosives. As an anticorrosive containing a heterocyclic ring having a nitrogen atom and an oxygen atom, examples thereof include oxazole-based, isoxazole-based, and oxadiazole-based anticorrosives. As an anticorrosive containing a heterocyclic ring having a nitrogen atom and a sulfur atom, examples thereof include thiazole-based, isothiazole-based, and thiadiazole-based anticorrosives. Above all, in particular, a benzotriazole (BTA)-based anticorrosive having an excellent anticorrosion effect is preferably used.

When the cleaning liquid A or B of the present invention is applied onto the substrate surface which has been polished with an abrasive containing such an anticorrosive, it is excellent from the standpoint that the contamination derived from such an anticorrosive can be extremely effectively removed.

That is, when such an anticorrosive is present in the abrasive, the corrosion of the Cu film surface is suppressed, and on the other hand, the anticorrosive reacts with a Cu ion eluted at the time of polishing, thereby producing a large quantity of an insoluble deposit. The cleaning liquid A or B of the present invention is able to efficiently dissolve and remove such an insoluble deposit, and furthermore, it is able to remove the surfactant which is easy to remain on the metal surface by means of rinsing within a short time and is possible to enhance throughput.

For that reason, the cleaning method of the present invention is suitable for cleaning of the substrate for semiconductor device after subjecting the surface on which the Cu film and the low-dielectric constant insulating film coexist to the CMP treatment, and in particular, it is suitable for cleaning of the above-described substrate which has been subjected to the CMP treatment with an abrasive containing an azole-based anticorrosive.

As described above, the cleaning method of the present invention is conducted by a method of bringing the cleaning liquid A or B of the present invention into direct contact with the substrate for semiconductor device. It is to be noted that a cleaning liquid having suitable concentrations of the components is selected in conformity with the kind of the substrate for semiconductor device which is subjective to cleaning.

Examples of the method of bringing the cleaning liquid into contact with the substrate include a dipping method of filling the cleaning liquid in a cleaning tank and dipping the substrate therein; a spinning method of rotating the substrate at a high speed while allowing the cleaning liquid to flow onto the substrate from a nozzle; a spraying method of spraying the liquid onto the substrate to clean the substrate; and the like. Examples of an apparatus for conducting such cleaning include a batch type cleaning apparatus in which a plurality of substrates accommodated in a cassette are simultaneously cleaned; a sheet-by-sheet type cleaning apparatus in which one substrate is installed in a holder and cleaned; and the like.

Although the cleaning liquid A or B of the present invention is applicable to any of the above-described methods, it is preferable to adopt cleaning of a spinning method or a spraying method from the standpoint that the contamination can be efficiently removed within a short time. In that case, when the cleaning liquid is applied to a sheet-by-sheet type cleaning apparatus in which shortening of a cleaning time or a decrease of the use amount of the cleaning liquid is desired, the foregoing problem is solved, and hence, such is preferable.

In addition, when the cleaning method of the present invention is conducted in combination with a cleaning method due to a physical force, in particular, scrub cleaning using a cleaning brush or ultrasonic cleaning at a frequency of 0.5 MHz or more, removal properties of the contamination due to fine particles attached onto the substrate is more enhanced, and this also leads to shortening of a cleaning time, and hence, such is preferable. In particular, in cleaning after the CMP step, it is preferable to conduct scrub cleaning using a resin-made brush. Although a material of the resin-made brush can be arbitrarily chosen, it is preferable to use, for example, PVA (polyvinyl alcohol).

Furthermore, cleaning with water may be conducted before and/or after cleaning by the cleaning method of the present invention.

In the cleaning method of the present invention, although the temperature of the cleaning liquid may be usually room temperature, the cleaning liquid may be heated at from about 40 to 70° C. within a range where its performance is not impaired.

EXAMPLES

The present invention is hereunder described in more detail by reference to the Examples, but it should be construed that the present invention is not limited to the following Examples unless otherwise its gist is changed.

Example A-1

<Preparation of Cleaning Liquid Stock Solution>

0.7% by mass of potassium hydroxide as an alkali, 1% by mass of L-cysteine as a chelating agent, 0.1% by mass of dodecylbenzenesulfonic acid as a sulfonic acid type anionic surfactant, and 1% by mass of lauryldimethylamine oxide as an amine oxide type surfactant were mixed with water, thereby preparing a stock solution of a cleaning liquid for semiconductor device of Example A-1 having a composition shown in Table 1.

Subsequently, water was added to the cleaning liquid stock solution, thereby preparing a 40-times diluted cleaning liquid for semiconductor device (diluted liquid).

<pH Measurement>

The 40-times diluted cleaning liquid was measured for pH with a pH meter ("D-24", manufactured by Horiba, Ltd.) while stirring using a magnetic stirrer. A measurement sample was kept at a liquid temperature of 25° C. in a thermostat. The measurement results are shown in Table 2.

<Surface Tension Measurement and CMC Measurement>

By using a liquid prepared by diluting the cleaning liquid stock solution 2.5 times, 5 times, 10 times, 20 times, 40 times, 60 times, 100 times, 200 times, and 400 times, respectively, about 2.5 µL of a liquid droplet was prepared at a tip of an injection needle, and a surface tension was measured from a curvature of the liquid droplet. A surface tensiometer "DM-700", manufactured by Kyowa Interface Science Co., Ltd. was used for the measurement. When the dilution rate is increased, the surface tension starts to decrease from a certain concentration. That concentration is called a critical micelle concentration (hereinafter referred to as "CMC"). As for the CMC obtained from the measurement results, the concentration relative to the cleaning liquid stock solution is shown in terms of % by volume. The obtained results are shown in Table 2.

<Cleaning Experiment of Cu Substrate>

On a silicon substrate in which a Cu film had been subjected to film fabrication by the PVD method (manufactured by Advantec), 200 mL of a 0.1% by mass benzotriazole aqueous solution was poured; subsequently, 200 mL of a 0.01% by mass colloidal silica aqueous solution (PL-10H, manufactured by Fuso Chemical Co., Ltd.) was poured; subsequently, 1 L of ultrapure water was poured; thereafter, the substrate was cleaned with the above-described 40-times diluted cleaning liquid by using a multi-spinner "KSSP-201" (manufactured by Kaijo Corporation); and thereafter, the number of defects of 0.23 µm or more was examined by using a wafer surface inspection device "LS-6600" (manufactured by Hitachi High-Technologies Corporation). The obtained results are shown in Table 2.

<Cleaning Experiment of BD1 Substrate>

On a silicon substrate in which a BD1 film (low-k film) that is an interlayer insulating film (manufactured by Advantec), 200 mL of a 0.01% by mass colloidal silica aqueous solution (PL-10H, manufactured by Fuso Chemical Co., Ltd.) was poured; subsequently, 1 L of ultrapure water was poured; thereafter, the substrate was cleaned with the above-described 40-times diluted cleaning liquid by using a multi-spinner "KSSP-201" (manufactured by Kaijo Corporation); and thereafter, the number of defects of 0.20 μm or more was examined by using a wafer surface inspection device "LS-6600" (manufactured by Hitachi High-Technologies Corporation). The obtained results are shown in Table 2.

<Measurement of Micelle Size>

Dynamic light scattering due to a micelle formed by the surfactant contained in the cleaning liquid stock solution was measured by using a dynamic light scattering meter "DLS-8000Ar" (manufactured by Otsuka Electronics Co., Ltd.). An average particle size and a polydispersity index were determined by means of the cumulant method analysis, and a particle size distribution was determined by means of the histogram method analysis. 500 accumulations were conducted by one measurement, and this measurement was conducted three times. An average value and a CV value obtained from the measurement of three times are shown as measurement results in Table 2. Here, the CV value expresses a variation in the measurement results and is calculated according to the equation:

[CV value (%)]=[(standard deviation)/(average value)]×100.

The obtained results are shown in Table 2.

<Cleaning Experiment of Residual Metal (Potassium)>

A bare silicon substrate was cleaned with the 40-times diluted cleaning liquid by using a multi-spinner "KSSP-201" (manufactured by Kaijo Corporation); thereafter, a metal component remaining on the substrate surface was recovered with 1 mL of 4% by mass hydrofluoric acid; and an amount of residual potassium (number of K atoms per $cm^2$ of the substrate surface: atoms/$cm^2$) by using ICP-MS ("ELEMENT 2", manufactured by Thermo Fisher Scientific K.K.). The obtained results are shown in Table 2.

<Dipping Experiment>

Two sheets of substrates fabricated by cutting a patterned substrate including a comb pattern with line/space=90 nm/90 nm ("CMP4-TEG", manufactured by Consortium for Advanced Semiconductor Materials and Related Technologies) into a size of 1 cm square were prepared and dipped in the 40-times diluted cleaning liquid at 25° C. for 5 minutes. Each of the substrates after dipping was taken out and immediately cleaned with ultrapure water, followed by drying by means of air blowing.

The substrate after completion of dipping was observed by a field emission scanning electron microscope ("JSM-6320F", manufactured by JEOL Ltd.) and evaluated for anticorrosiveness. It is to be noted that the anticorrosiveness was decided in terms of a degree of progress of corrosion of the copper wiring pattern and evaluated according to the following criteria. The obtained results are shown in Table 2.

A: The corrosion was not confirmed at all.
B: The corrosion was not substantially confirmed.
C: The corrosion was confirmed.

In addition, an SEM image of the patterned substrate surface after the dipping experiment is shown in FIG. 1.

Example A-2

0.7% by mass of potassium hydroxide as an inorganic alkali, 1% by mass of L-cysteine as a chelating agent, 0.1% by mass of dodecylbenzenesulfonic acid as a sulfonic acid type anionic surfactant, and 0.5% by mass of lauryldimethylamine oxide as an amine oxide type surfactant were mixed with water, thereby preparing a stock solution of a cleaning liquid for semiconductor device of Example A-2 having a composition shown in Table 1.

Subsequently, water was added to the cleaning liquid stock solution, thereby preparing a 40-times diluted cleaning liquid for semiconductor device (diluted liquid).

These cleaning liquid stock solution and cleaning liquid were evaluated in the same manners as those in Example A-1, and the results are shown in Table 2.

Example A-3

0.72% by mass of potassium hydroxide as an alkali, 1.00% by mass of L-cysteine as a chelating agent, 0.10% by mass of dodecylsulfonic acid as a sulfonic acid type anionic surfactant, and 1.00% by mass of lauryldimethylamine oxide as an amine oxide type surfactant were mixed with water, thereby preparing a stock solution of a cleaning liquid for semiconductor device of Example A-3 having a composition shown in Table 1.

Subsequently, water was added to the cleaning liquid stock solution, thereby preparing a 40-times diluted cleaning liquid for semiconductor device (diluted liquid).

These cleaning liquid stock solution and cleaning liquid were evaluated in the same manners as those in Example A-1, and the results are shown in Table 2.

Example A-4

2% by mass of potassium hydroxide as an inorganic alkali, 1% by mass of citric acid and 1% by mass histidine as a chelating agent, 0.1% by mass of dodecylbenzenesulfonic acid as a sulfonic acid type anionic surfactant, and 1% by mass of lauryldimethylamine oxide as an amine oxide type surfactant were mixed with water, thereby preparing a stock solution of a cleaning liquid for semiconductor device of Example A-4 having a composition shown in Table 1.

Subsequently, water was added to the cleaning liquid stock solution, thereby preparing a 40-times diluted cleaning liquid for semiconductor device (diluted liquid).

These cleaning liquid stock solution and cleaning liquid were evaluated in the same manners as those in Example A-1, and the results are shown in Table 2.

Figure 2:
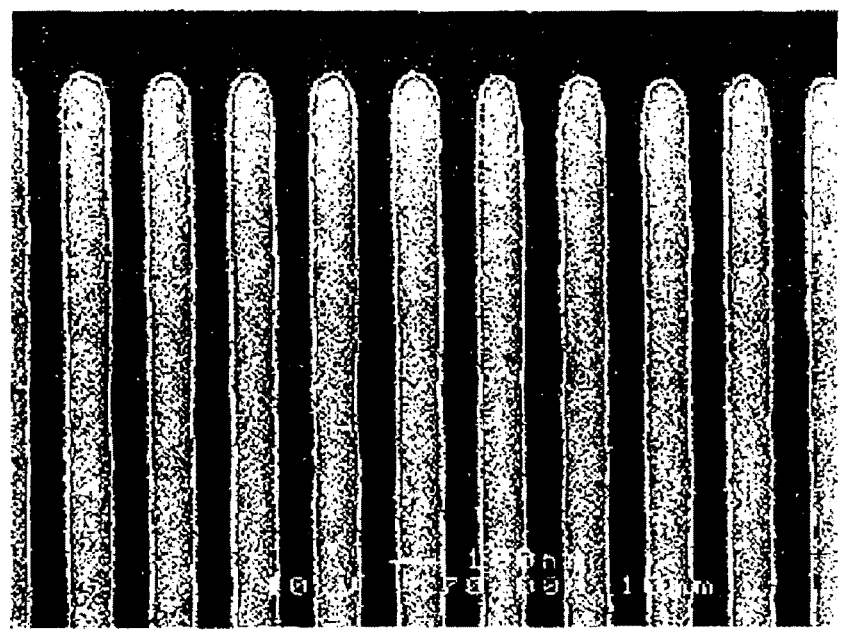
FIG. 2 is an SEM image of a patterned substrate surface after a dipping experiment in Example A-4.

In addition, an SEM image of the patterned substrate surface after the dipping experiment is shown in FIG. 2.

Comparative Example A-1

0.7% by mass of potassium hydroxide as an inorganic alkali, 1% by mass of L-cysteine as a chelating agent, and 0.1% by mass of dodecylbenzenesulfonic acid as a sulfonic acid type anionic surfactant were mixed with water, thereby preparing a stock solution of a cleaning liquid for semiconductor device of Comparative Example A-1 having a composition shown in Table 1.

Subsequently, water was added to the cleaning liquid stock solution, thereby preparing a 40-times diluted cleaning liquid for semiconductor device (diluted liquid).

These cleaning liquid stock solution and cleaning liquid were evaluated in the same manners as those in Example A-1, and the results are shown in Table 2.

Comparative Example A-2

0.7% by mass of potassium hydroxide as an inorganic alkali, 1% by mass of L-cysteine as a chelating agent, and 0.1% by mass of dodecylsulfonic acid as a sulfonic acid type anionic surfactant were mixed with water, thereby preparing a stock solution of a cleaning liquid for semiconductor device of Comparative Example A-2 having a composition shown in Table 1.

Subsequently, water was added to the cleaning liquid stock solution, thereby preparing a 40-times diluted cleaning liquid for semiconductor device (diluted liquid).

These cleaning liquid stock solution and cleaning liquid were evaluated in the same manners as those in Example A-1, and the results are shown in Table 2.

Comparative Example A-3

0.7% by mass of potassium hydroxide as an inorganic alkali, 1% by mass of L-cysteine as a chelating agent, and 0.1% by mass of lauryldimethylamine oxide as an amine oxide type surfactant were mixed with water, thereby preparing a stock solution of a cleaning liquid for semiconductor device of Comparative Example A-3 having a composition shown in Table 1.

Subsequently, water was added to the cleaning liquid stock solution, thereby preparing a 40-times diluted cleaning liquid for semiconductor device (diluted liquid).

These cleaning liquid stock solution and cleaning liquid were evaluated in the same manners as those in Example A-1, and the results are shown in Table 2.

Comparative Example A-4

10% by mass of citric acid as an acid, 1% by mass of glycine as a chelating agent, 0.1% by mass of dodecylbenzenesulfonic acid as a sulfonic acid type anionic surfactant, and 1% by mass of lauryldimethylamine oxide as an amine oxide type surfactant were mixed with water, thereby preparing a stock solution of a cleaning liquid for semiconductor device.

It is to be noted that although citric acid is also the chelating agent, it functions as the acid in the blending amount in the present comparative example.

Subsequently, water was added to the cleaning liquid stock solution, thereby preparing a 40-times diluted cleaning liquid for semiconductor device (diluted liquid).

These cleaning liquid stock solution and cleaning liquid were evaluated in the same manners as those in Example A-1, and the results are shown in Table 2.

Comparative Example A-5

1% by mass of potassium hydroxide as an inorganic alkali was mixed with water, thereby preparing a stock solution of a cleaning liquid for semiconductor device.

Subsequently, water was added to the cleaning liquid stock solution, thereby preparing a 40-times diluted cleaning liquid for semiconductor device (diluted liquid).

These cleaning liquid stock solution and cleaning liquid were evaluated in the same manners as those in Example A-1, and the results are shown in Table 2.

TABLE 1

| | <Composition of cleaning liquid stock solution> | | | | | | | |
|---|---|---|---|---|---|---|---|---|
| | KOH | Acid (citric acid) | Chelating agent | | Sulfonic acid type anionic surfactant | | Amine oxide type surfactant | |
| | concentration (% by mass) | concentration (% by mass) | Kind | Concentration (% by mass) | Kind | Concentration (% by mass) | Kind | Concentration (% by mass) |
| Example A-1 | 0.7 | — | L-Cysteine | 1 | Dodecylbenzene sulfonic acid | 0.1 | Lauryldimethyl amine oxide | 1 |
| Example A-2 | 0.7 | — | L-Cysteine | 1 | Dodecylbenzene sulfonic acid | 0.1 | Lauryldimethyl amine oxide | 0.5 |
| Example A-3 | 0.7 | — | L-Cysteine | 1 | Dodecylsulfonic acid | 0.1 | Lauryldimethyl amine oxide | 1 |
| Example A-4 | 2 | — | Citric acid Histidine | 1 1 | Dodecylsulfonic acid | 0.1 | Lauryldimethyl amine oxide | 1 |
| Comparative Example A-1 | 0.7 | — | L-Cysteine | 1 | Dodecylbenzene sulfonic acid | 0.1 | — | — |
| Comparative Example A-2 | 0.7 | — | L-Cysteine | 1 | Dodecylsulfonic acid | 0.1 | — | — |
| Comparative Example A-3 | 0.7 | — | L-Cysteine | 1 | — | — | Lauryldimethyl amine oxide | 0.1 |
| Comparative Example A-4 | — | 10 | Glycine | 1 | Dodecylbenzene sulfonic acid | 0.1 | Lauryldimethyl amine oxide | 1 |
| Comparative Example A-5 | 1 | — | — | — | — | — | — | — |

TABLE 2

<Evaluation results>

| | pH of cleaning liquid (40-times diluted) | CMC of cleaning liquid stock solution (% by volume) | Results of cleaning experiment of Cu substrate (number of defects) | Results of cleaning experiment of BD1 substrate (number of defects) | Micelle size Average value (nm) | Micelle size CV value (%) | Cleaning experiment of residual metal (potassium) (atoms/cm$^2$) | Dipping experiment |
|---|---|---|---|---|---|---|---|---|
| Example A-1 | 11 | 2.3 | 113 | 439 | 9.4 | 0.6 | 6.3 × 10$^{10}$ | B |
| Example A-2 | 11 | 2.3 | 130 | 443 | — | — | — | — |
| Example A-3 | 10 | 3.2 | 270 | — | 6.3 | 2.7 | — | — |
| Example A-4 | 11 | — | 141 | — | — | — | 18 × 10$^{10}$ | A |
| Comparative Example A-1 | 11 | 13.0 | 199 | 8919 | 71.5 | 1.3 | — | — |
| Comparative Example A-2 | 11 | 20.0 | — | — | — | — | — | — |
| Comparative Example A-3 | 11 | 5.2 | 428 | — | 5.3 | 1.9 | — | — |
| Comparative Example A-4 | 3 | — | 11139 | 2691 | — | — | — | — |
| Comparative Example A-5 | 11 | — | 3609 | — | — | — | 76 × 10$^{10}$ | — |

[Consideration]
<Results of CMC Measurement>

The cleaning liquid stock solutions described in Examples A-1 to A-3 have low CMC and exhibit the effect to be brought due to the addition of lauryldimethylamine oxide. In addition, in Comparative Examples A-1 and A-2, the CMC is 13.0% by volume and 20.0% by volume, respectively. In Comparative Example A-3, the CMC is 5.2% by volume, and the CMC value is decreased by the addition of lauryldimethylamine oxide; however, as compared with Examples A-1 to A-3, the CMC value is high and is not thoroughly decreased yet.

<Results of Cleaning Experiment of Cu Substrate>

In the cleaning experiment of the Cu substrate with the cleaning liquid described in each of Examples A-1 to A-3 and Comparative Example A-1, good results were obtained. On the other hand, in the cleaning liquids described in Comparative Examples A-3 and A-5, the anionic surfactant selected from sulfonic acid type and sulfuric acid type anionic surfactants was not added, and in the cleaning experiment of the Cu substrate, good results were not obtained. It is understood that as compared with the acidic cleaning liquid described in Comparative Example A-4, the cleaning liquids of Examples A-1 and A-3 are high in the cleaning effect on the Cu substrate surface.

<Results of Cleaning Experiment of BD1 Substrate>

The cleaning liquids described in Examples A-1 and A-2 exhibited a synergistic effect to be brought due to dodecylbenzenesulfonic acid and lauryldimethylamine oxide, and the number of defects detected showed a low value as 439 and 443, respectively.

Similar to Example A-1, the cleaning liquid described in Example A-3 exhibited a synergistic effect to be brought due to dodecylsulfonic acid and lauryldimethylamine oxide, and it is analogized that the cleaning liquid described in Example A-3 has sufficient cleaning ability.

In the cleaning liquid described in Comparative Example A-1, lauryldimethylamine oxide is not added, and it was confirmed that according to single use of dodecylbenzenesulfonic acid, the defect removal ability is not sufficient.

It can be analogized that the cleaning ability of the cleaning liquid described in Comparative Example A-2 gives the same results as the cleaning results in Comparative Example A-1.

The cleaning liquid described in Comparative Example A-4 is an acidic cleaning liquid in which an acid, in particular, an organic acid is used as a main component in place of the inorganic alkali, and as a result of the <Cleaning experiment of DB1 substrate> using this cleaning liquid, the number of defects showed a high value as 2,691. Thus, it is understood that as compared with the cleaning liquid containing, as a main component, the inorganic alkali according to the present invention, the cleaning ability on the insulating film substrate is not sufficient.

<Results of Measurement of Micelle Size>

In the measurement of micelle size using the cleaning liquid described in Comparative Example A-1, the micelle size showed a very large value as 71.5 nm. In the cleaning liquid of Comparative Example A-1, lauryldimethylamine oxide is not added, and it is understood that configuration of the surfactant molecules is different. In addition, it may be considered that this is a cause that good results were not obtained in the cleaning experiment of the BD1 substrate.

In the measurement of micelle size using each of the cleaning liquids described in Examples A-1 and A-3 and Comparative Example A-3, it is confirmed that small micelles of not more than 10 nm were formed, and the CV value expressing a variation in the measurement results also showed a low value.

<Results of Cleaning Experiment of Residual Metal (Potassium)>

As compared with Examples A-1 and A-4, in the cleaning liquid of Comparative Example A-5, the residual metal (potassium) could not be thoroughly removed, and therefore, it is understood that even by using an alkaline cleaning liquid, the cleaning liquid of the present invention has such an effect that the residual metal (potassium) can be decreased.

<Results of Dipping Experiment>

In the case of using the cleaning liquid of each of Examples A-1 and A-4, it is understood that cleaning can be conducted without substantially or entirely corroding the Cu wiring surface and Cu wiring end.

Example B-1

<Preparation of Cleaning Liquid Stock Solution>

0.8% by mass of potassium hydroxide as an inorganic alkali, 1% by mass of L-cysteine as a chelating agent, 0.1% by mass of dodecylbenzenesulfonic acid (hereinafter sometimes abbreviated as "DBS") as an anionic surfactant, and 1% by mass of polyoxyethylene lauryl ether acetic acid (hereinafter sometimes abbreviated as "SF-S") as other component were mixed with water, thereby preparing a stock solution of a cleaning liquid for semiconductor device of Example B-1 having a composition shown in Table 3.

Subsequently, water was added to the cleaning liquid stock solution, thereby preparing a 40-times diluted cleaning liquid for semiconductor device (diluted liquid).

<pH Measurement>

The 40-times diluted cleaning liquid was measured for pH with a pH meter ("D-24", manufactured by Horiba, Ltd.) while stirring using a magnetic stirrer. A measurement sample was kept at a liquid temperature of 25° C. in a thermostat. The measurement results are shown in Table 3.

<Cleaning Experiment B-1>

A bare silicon substrate was cleaned with the 40-times diluted cleaning liquid by using a multi-spinner "KSSP-201" (manufactured by Kaijo Corporation); thereafter, a metal component remaining on the substrate surface was recovered with 1 mL of 4% by mass hydrofluoric acid; and an amount of residual potassium (number of K atoms per $cm^2$ of the substrate surface: atoms/$cm^2$) by using ICP-MS ("ELEMENT 2", manufactured by Thermo Fisher Scientific K.K.). The obtained results are shown in Table 3.

<Cleaning Experiment B-2>

On a silicon substrate in which a Cu film had been subjected to film fabrication by the PVD method (manufactured by Advantec), 200 mL of a 0.1% by mass benzotriazole aqueous solution was poured; subsequently, 200 mL of a 0.01% by mass colloidal silica aqueous solution (PL-10H, manufactured by Fuso Chemical Co., Ltd.) was poured; subsequently, 1 L of ultrapure water was poured; thereafter, the substrate was cleaned with the above-described 40-times diluted cleaning liquid by using a multi-spinner "KSSP-201" (manufactured by Kaijo Corporation); and thereafter, the number of defects of 0.23 µm or more was examined by using a wafer surface inspection device "LS-6600" (manufactured by Hitachi High-Technologies Corporation). The obtained results are shown in Table 3.

<Cleaning Experiment B-3>

On a silicon substrate in which a BD1 film (low-k film) that is an interlayer insulating film (manufactured by Advantec), 200 mL of a 0.01% by mass colloidal silica aqueous solution (PL-10H, manufactured by Fuso Chemical Co., Ltd.) was poured; subsequently, 1 L of ultrapure water was poured; thereafter, the substrate was cleaned with the above-described 40-times diluted cleaning liquid by using a multi-spinner "KSSP-201" (manufactured by Kaijo Corporation); and thereafter, the number of defects of 0.20 µm or more was examined by using a wafer surface inspection device "LS-6600" (manufactured by Hitachi High-Technologies Corporation).

<Dipping Experiment>

Two sheets of substrates fabricated by cutting a patterned substrate including a comb pattern with line/space=90 nm/90 nm ("CMP4-TEG", manufactured by Consortium for Advanced Semiconductor Materials and Related Technologies) into a size of 1 cm square were prepared and dipped in the 40-times diluted cleaning liquid at 25° C. for 5 minutes. Each of the substrates after dipping was taken out and immediately cleaned with ultrapure water, followed by drying by means of air blowing.

The substrate after completion of dipping was observed by a field emission scanning electron microscope ("JSM-6320F", manufactured by JEOL Ltd.) and evaluated for anticorrosiveness. It is to be noted that the anticorrosiveness was decided in terms of a degree of progress of corrosion of the copper wiring pattern and evaluated according to the following criteria. The obtained results are shown in Table 3.

A: The corrosion was not confirmed at all.
B: The corrosion was not substantially confirmed.
C: The corrosion was confirmed.

Figure 3:
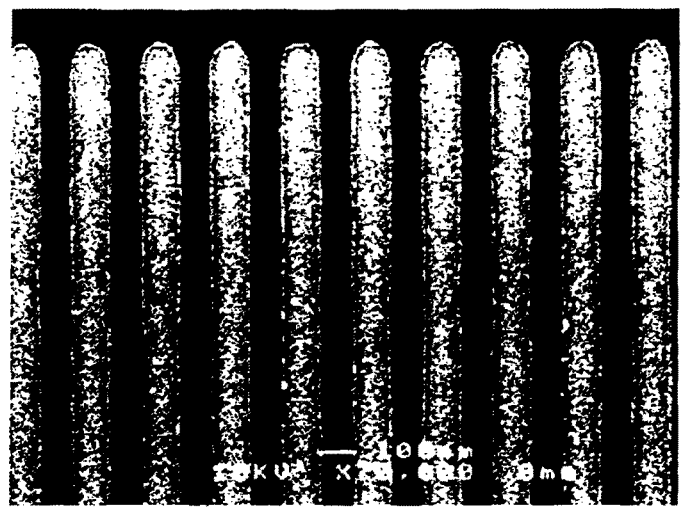
FIG. 3 is an SEM image of a patterned substrate surface after a dipping experiment in Example B-1.

In addition, an SEM image of the patterned substrate surface after the dipping experiment is shown in FIG. 3.

Example B-2

0.7% by mass of potassium hydroxide as an inorganic alkali, 1% by mass of L-cysteine as a chelating agent, 0.1% by mass of dodecylbenzenesulfonic acid as an anionic surfactant, and 1% by mass of lauryldimethylamine oxide (hereinafter sometimes abbreviated as "SF-Z") as other component were mixed with water, thereby preparing a stock solution of a cleaning liquid for semiconductor device of Example B-2 having a composition shown in Table 3.

Subsequently, water was added to the cleaning liquid stock solution, thereby preparing a 40-times diluted cleaning liquid for semiconductor device (diluted liquid).

By using the obtained cleaning liquid, the pH measurement, the cleaning experiments B-1 and B-2, and the dipping experiment as well as the following cleaning experiment B-3 were conducted in the same manners as those in Example B-1. The results are shown in Table 3.

Figure 4:
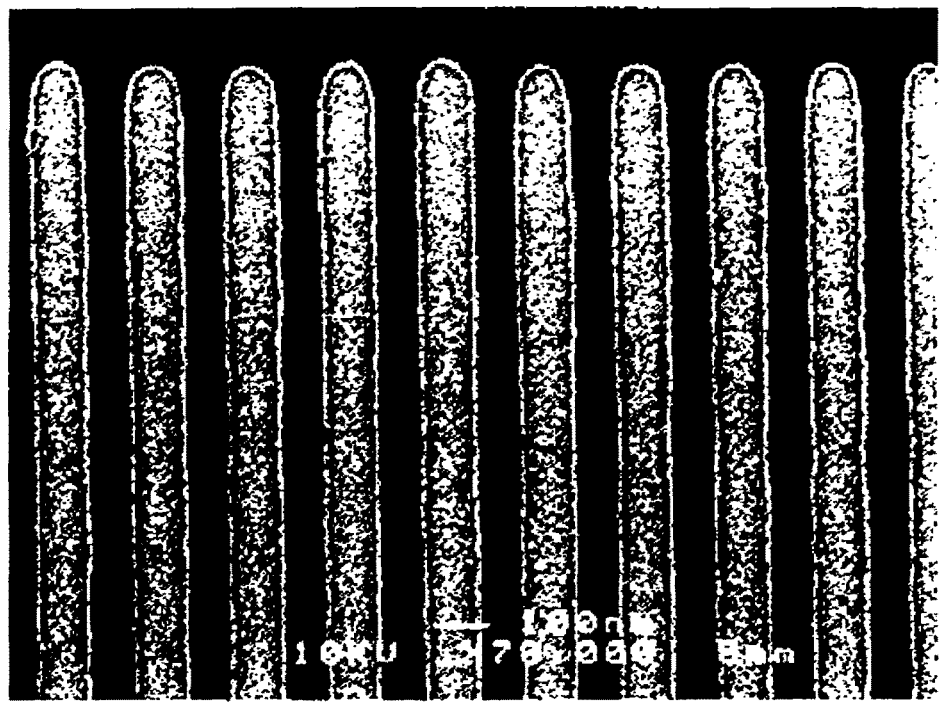
FIG. 4 is an SEM image of a patterned substrate surface after a dipping experiment in Example B-2.

In addition, an SEM image of the patterned substrate surface after the dipping experiment is shown in FIG. 4.

Example B-3

0.7% by mass of potassium hydroxide as an inorganic alkali, 1% by mass of L-cysteine as a chelating agent, and 0.1% by mass of dodecylbenzenesulfonic acid as an anionic surfactant were mixed with water, thereby preparing a stock solution of a cleaning liquid for semiconductor device of Example B-3 having a composition shown in Table 3.

Subsequently, water was added to the cleaning liquid stock solution, thereby preparing a 40-times diluted cleaning liquid for semiconductor device (diluted liquid).

By using the obtained cleaning liquid, the pH measurement, the cleaning experiment B-2, and the dipping experiment were conducted in the same manners as those in Example B-1. The results are shown in Table 3.

Figure 5:
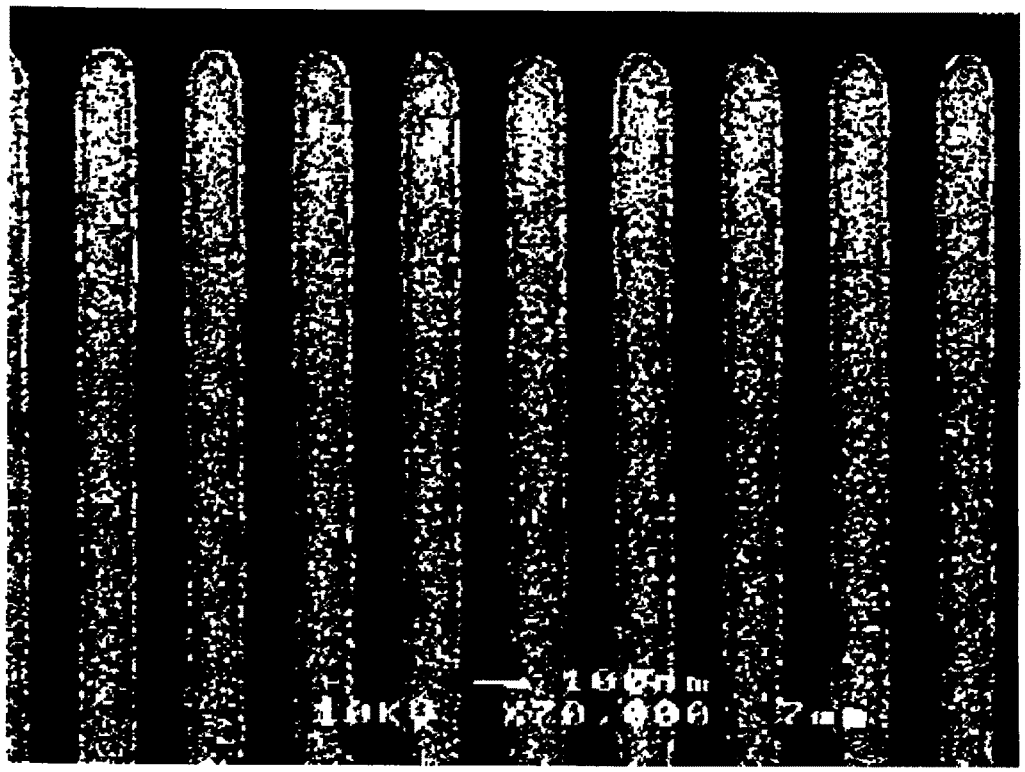
FIG. 5 is an SEM image of a patterned substrate surface after a dipping experiment in Example B-3.

In addition, an SEM image of the patterned substrate surface after the dipping experiment is shown in FIG. 5.

Example B-4

1% by mass of potassium hydroxide as an inorganic alkali, 1% by mass of glycine as a chelating agent, 0.1% by mass of dodecylbenzenesulfonic acid as an anionic surfactant, and 1% by mass of polyoxyethylene lauryl ether acetic acid as other component were mixed with water, thereby preparing a stock solution of a cleaning liquid for semiconductor device of Example B-4 having a composition shown in Table 3.

Subsequently, water was added to the cleaning liquid stock solution, thereby preparing a 40-times diluted cleaning liquid for semiconductor device (diluted liquid).

By using the obtained cleaning liquid, the pH measurement and the cleaning experiment B-2 were conducted in the same manners as those in Example B-1. The results are shown in Table 3.

Figure 7:
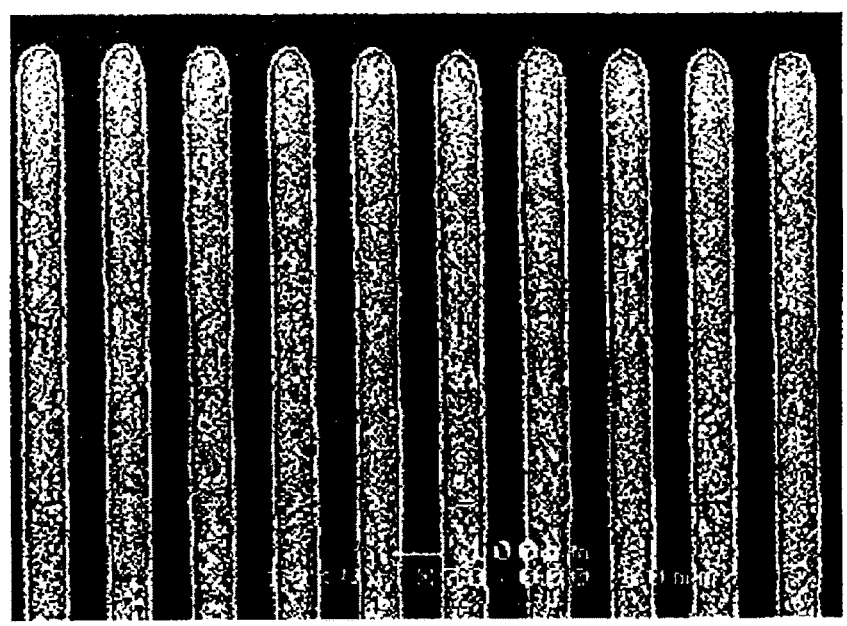
FIG. 7 is an SEM image of a patterned substrate surface after a dipping experiment in Example B-4.

In addition, an SEM image of the patterned substrate surface after the dipping experiment is shown in FIG. 7.

Example B-5

0.6% by mass of potassium hydroxide as an inorganic alkali, 1% by mass of picolinic acid as a chelating agent, 0.1% by mass of dodecylbenzenesulfonic acid as an anionic surfactant, and 1% by mass of polyoxyethylene lauryl ether acetic acid as other component were mixed with water, thereby preparing a stock solution of a cleaning liquid for semiconductor device of Example B-5 having a composition shown in Table 3.

Subsequently, water was added to the cleaning liquid stock solution, thereby preparing a 40-times diluted cleaning liquid for semiconductor device (diluted liquid).

By using the obtained cleaning liquid, the pH measurement and the cleaning experiment B-2 were conducted in the same manners as those in Example B-1. The results are shown in Table 3.

Example B-6

2% by mass of potassium hydroxide as an inorganic alkali, 1% by mass of citric acid and 1% by mass of histidine as a chelating agent, 0.1% by mass of dodecylbenzenesulfonic acid as an anionic surfactant, and 1% by mass of lauryldimethylamine oxide as other component were mixed with water, thereby preparing a stock solution of a cleaning liquid for semiconductor device of Example B-6 having a composition shown in Table 3.

Subsequently, water was added to the cleaning liquid stock solution, thereby preparing a 40-times diluted cleaning liquid for semiconductor device (diluted liquid).

By using the obtained cleaning liquid, the pH measurement, the cleaning experiment B-1, the cleaning experiment B-2, and the dipping experiment were conducted in the same manners as those in Example B-1. The results are shown in Table 3.

Figure 8:
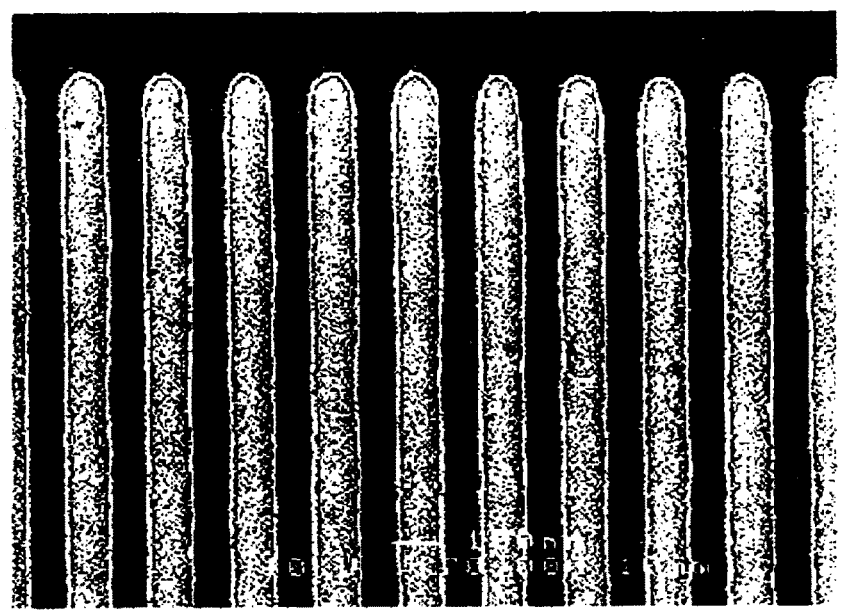
FIG. 8 is an SEM image of a patterned substrate surface after a dipping experiment in Example B-6.

In addition, an SEM image of the patterned substrate surface after the dipping experiment is shown in FIG. 8.

Comparative Example B-1

1% by mass of potassium hydroxide as an inorganic alkali was mixed with water, thereby preparing a stock solution of a cleaning liquid for semiconductor device of Comparative Example B-1 having a composition shown in Table 3.

Subsequently, water was added to the cleaning liquid stock solution, thereby preparing a 40-times diluted cleaning liquid for semiconductor device (diluted liquid).

By using the obtained cleaning liquid, the pH measurement, the cleaning experiment B-1, the cleaning experiment B-2, and the dipping experiment were conducted in the same manners as those in Example B-1. The results are shown in Table 3.

Figure 9:
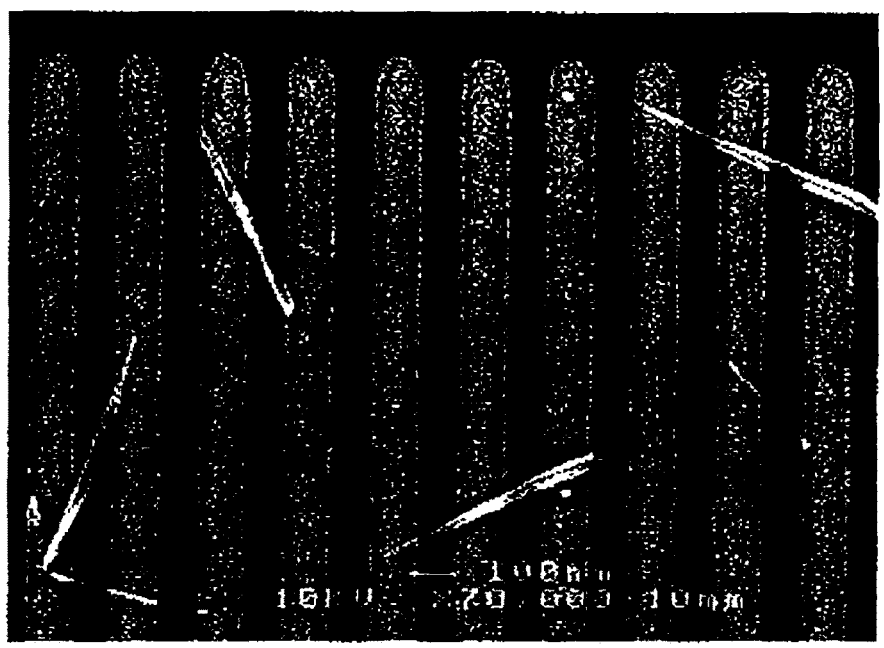
FIG. 9 is an SEM image of a patterned substrate surface after a dipping experiment in Comparative Example B-1.

In addition, an SEM image of the patterned substrate surface after the dipping experiment is shown in FIG. 9.

Comparative Example B-2

1% by mass of ethylenediamine as a chelating agent, 0.1% by mass of dodecylbenzenesulfonic acid as an anionic surfactant, and 1% by mass of polyoxyethylene lauryl ether acetic acid as other component were mixed with water, thereby preparing a stock solution of a cleaning liquid for semiconductor device of Comparative Example B-2 having a composition shown in Table 3.

Subsequently, water was added to the cleaning liquid stock solution, thereby preparing a 40-times diluted cleaning liquid for semiconductor device (diluted liquid).

By using the obtained cleaning liquid, the pH measurement, the cleaning experiment B-2, and the dipping experiment were conducted in the same manners as those in Example B-1. The results are shown in Table 3.

Figure 6:
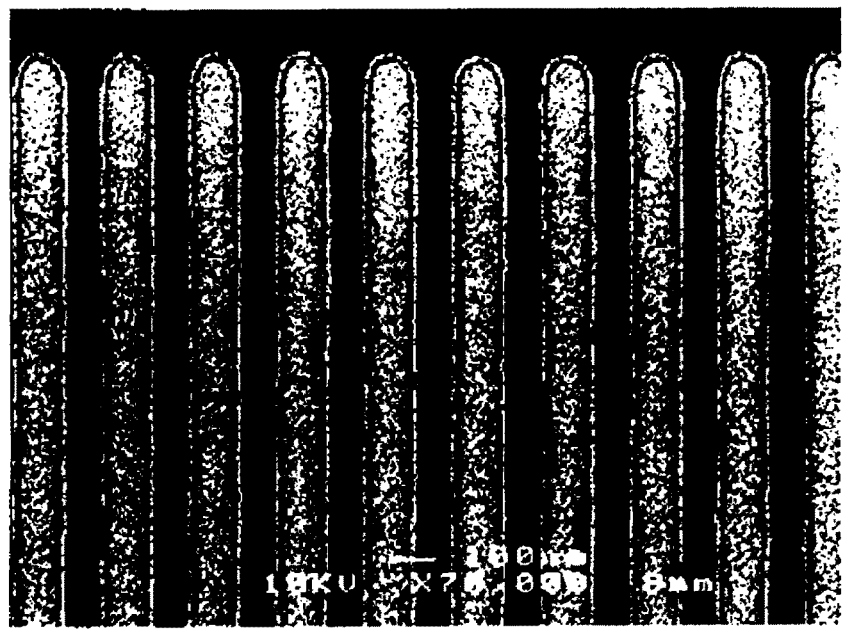
FIG. 6 is an SEM image of a patterned substrate surface after a dipping experiment in Comparative Example B-2.

In addition, an SEM image of the patterned substrate surface after the dipping experiment is shown in FIG. 6.

Comparative Example B-3

10% by mass of citric acid as an acid, 1% by mass of glycine as a chelating agent, 0.1% by mass of dodecylbenzenesulfonic acid as a sulfonic acid type anionic surfactant, and 1% by mass of lauryldimethylamine oxide as other component were mixed with water, thereby preparing a stock solution of a cleaning liquid for semiconductor device.

It is to be noted that although citric acid is also the chelating agent, it functions as the acid in the blending amount in the present comparative example.

Subsequently, water was added to the cleaning liquid stock solution, thereby preparing a 40-times diluted cleaning liquid for semiconductor device (diluted liquid).

By using the obtained cleaning liquid, the pH measurement, the cleaning experiment B-2, and the cleaning experiment B-3 were conducted in the same manners as those in Examples B-1 and B-2. The results are shown in Table 3.

TABLE 3

<Composition of cleaning liquid stock solution and pH of cleaning liquid, and experiment results>

| | Composition of cleaning liquid stock solution | | | | | | | Experiment results | | | |
|---|---|---|---|---|---|---|---|---|---|---|---|
| | KOH concentration (% by mass) | Acid citric acid) concentration (% by mass) | Chelating agent Kind | Concentration (% by mass) | Concentration of surfactant (% by mass) DBS | SF-S | SF-Z | pH of cleansing liquid | Cleaning experiment 1 (atoms/cm$^2$) | Cleaning experiment 2 (number of defects) | Cleaning experiment 3 (number of defects) | Dipping experiment |
| Example B-1 | 0.8 | — | L-Cysteine | 1 | 0.1 | 1 | — | 11 | $8.8 \times 10^{10}$ | 199 | — | A |
| Example B-2 | 0.7 | — | L-Cysteine | 1 | 0.1 | — | 1 | 11 | $6.3 \times 10^{10}$ | 118 | 439 | B |

TABLE 3-continued

<Composition of cleaning liquid stock solution and pH of cleaning liquid, and experiment results>

| | Composition of cleaning liquid stock solution | | | | | | | | Experiment results | | | |
|---|---|---|---|---|---|---|---|---|---|---|---|---|
| | KOH concentration (% by mass) | Acid citric acid) concentration (% by mass) | Chelating agent | | Concentration (% by mass) | Concentration of surfactant (% by mass) | | | pH of cleansing liquid | Cleaning experiment 1 (atoms/cm$^2$) | Cleaning experiment 2 (number of defects) | Cleaning experiment 3 (number of defects) | Dipping experiment |
| | | | Kind | | | DBS | SF-S | SF-Z | | | | | |
| Example B-3 | 0.7 | — | L-Cysteine | | 1 | 0.1 | — | — | 11 | — | 113 | — | B |
| Example B-4 | 1 | — | Glycine | | 1 | 0.1 | 1 | — | 10 | — | 172 | — | B |
| Example B-5 | 0.6 | — | Picolinic acid | | 1 | 0.1 | 1 | — | 8 | — | 73 | — | — |
| Example B-6 | 2 | — | Citric acid Histidine | | 1 1 | 0.1 | — | 1 | 11 | 18 × 10$^{10}$ | 141 | — | A |
| Comparative Example B-1 | 1 | — | — | | — | — | — | — | 11 | 76 × 10$^{10}$ | 3609 | — | B* |
| Comparative Example B-2 | — | — | Ethylenediamine | | 1 | 0.1 | 1 | — | 11 | — | 8640 | — | C |
| Comparative Example B-3 | — | 10 | Glycine | | 1 | 0.1 | — | 1 | 3 | — | 11139 | 2691 | — |

*A foreign matter was generated on the substrate surface.

[Consideration]

<Results of Cleaning Experiment B-1>

In Examples B-1, B-2 and B-6, the K ion remained in the number of 8.8×10$^{10}$, 6.3×10$^{10}$ and 18×10$^{10}$ atoms/cm$^2$, respectively on the silicon substrate, whereas in Comparative Example B-1, the K ion remained in the number of 76×10$^{10}$ atoms/cm$^2$. It could be confirmed that the cleaning liquid of the present invention does not retain a large quantity of the K ion on the silicon substrate.

<Results of Cleaning Experiment B-2>

As a result of the examination of any foreign matter, in the case of using the cleaning liquid of each of Examples B-1 to B-6, not more than 200 defects were detected, whereas 3,609 defects, 8,640 defects, and 11,139 defects were detected in Comparative Example B-1, Comparative Example B-2, and Comparative Example B-3, respectively.

In Comparative Example B-1, since the carboxyl group-containing chelating agent and the anionic surfactant, both of which are the essential components of the present invention, are not contained, good results are not obtained. In Comparative Example B-2, although the inorganic alkali was not contained, and ethylenediamine was used in place of the carboxyl group-containing chelating agent which is the essential component of the present invention, the number of foreign matters was higher as 8,640, and good results were not obtained. In addition, in Comparative Example B-3, since the inorganic alkali is not contained, even by using the carboxyl group-containing chelating agent and the anionic surfactant, good results were not obtained.

<Results of Cleaning Experiment B-3>

In Example B-2, 439 detects were detected, whereas in Comparative Example B-3, the number of defects was remarkably large as 2,691. The cleaning liquid of Comparative Example B-3 does not contain the inorganic alkali, and good results are not obtained.

<Results of Dipping Experiment>

In the case of using the cleaning liquid of each of Examples B-1 to B-4 and B-6, the Cu wiring surface and Cu wiring end are not substantially or entirely corroded. On the other hand, in the case of using the cleaning liquid of Comparative Example B-1, although corrosion was not substantially confirmed, as is clear from FIG. 9, foreign matters were generated on the substrate surface. In addition, in the case of using the cleaning liquid of Comparative Example B-2, the Cu wiring end was dissolved in ethylenediamine that is the chelating agent and confirmed to be corroded.

It is clear from the foregoing results that by using the cleaning liquid of the present invention, a large quantity of K ions is not made to remain on the substrate for semiconductor device having a Cu wiring and a low-dielectric constant insulating film after conducting cleaning after the CMP step, corrosion is not caused on the Cu wiring, and the foreign matters generated by the CMP step can be effectively removed. Namely, it is clear that an excellent cleaning effect of the substrate for semiconductor device is brought.

While the present invention has been described in detail and with reference to specific embodiments thereof, it will be apparent to one skilled in the art that various changes and modifications can be made therein without departing from the spirit and scope thereof.

The present application is based on a Japanese patent application filed on Feb. 17, 2012 (Japanese Patent Application No. 2012-32860) and a Japanese patent application filed on Mar. 28, 2012 (Japanese Patent Application No. 2012-73633), and the contents thereof are incorporated herein by reference.

INDUSTRIAL APPLICABILITY

The cleaning liquid for semiconductor device of the present invention is able to efficiently conduct cleaning without causing corrosion on a surface of an substrate for semiconductor device and is good in water rinsing properties, and therefore, the present invention is very industrially useful as a cleaning treatment technology of a contaminated substrate for semiconductor device in a manufacturing step of a semiconductor device, a display device, or the like.

The invention claimed is:

1. A cleaning liquid for a semiconductor device, comprising the following components (1)' to (4)':

(1)' an inorganic alkali;
(2)' a carboxyl group-containing chelating agent, which is at least one amino acid selected from the group consisting of cysteine and histidine;
(3)' an anionic surfactant which is at least one of a benzenesulfonic acid substituted with an alkyl group having from 8 to 20 carbon atoms and a salt thereof; and
(4)' water,
wherein the cleaning liquid has a pH of 9 or more.

2. The cleaning liquid according to claim 1, wherein the inorganic alkali is contained in a concentration of from 0.005 to 0.1% by mass, and the chelating agent is contained in a concentration of from 0.005 to 0.1% by mass.

3. The cleaning liquid according to claim 1, wherein the inorganic alkali is potassium hydroxide.

4. The cleaning liquid according to claim 1, wherein the anionic surfactant is dodecylbenzenesulfonic acid.

5. A stock solution of the cleaning liquid according to claim 1, wherein the inorganic alkali is contained in a concentration of from 0.1 to 10% by mass, and the chelating agent is contained in a concentration of from 0.1 to 10% by mass.

6. A method for cleaning a substrate for semiconductor device, comprising contacting a substrate for semiconductor device having a Cu wiring and a low-dielectric constant insulating film on a surface thereof, the substrate being one after conducting chemical mechanical polishing, with the cleaning liquid according to claim 1.

7. The cleaning liquid according to claim 1, comprising:
(1) 0.005 to 0.1% by mass of potassium hydroxide;
(2) 0.005 to 0.1% by mass of the carboxyl group-containing chelating agent;
(3) 0.0005 to 0.01% by mass of dodecylbenzenesulfonic acid; and
(4) water.

8. The cleaning liquid according to claim 1, comprising:
(1) 0.02 to 0.08% by mass of potassium hydroxide;
(2) 0.02 to 0.08% by mass of the carboxyl group-containing chelating agent;
(3) 0.002 to 0.008% by mass of dodecylbenzenesulfonic acid; and
(4) water.

* * * * *